(12) United States Patent
Foegelle

(10) Patent No.: US 9,322,864 B2
(45) Date of Patent: Apr. 26, 2016

(54) METHODS AND APPARATUS FOR EVALUATING RADIATED PERFORMANCE OF MIMO WIRELESS DEVICES IN THREE DIMENSIONS

(71) Applicant: ETS-Lindgren, LP, Cear Park, TX (US)

(72) Inventor: Michael Foegelle, Cedar Park, TX (US)

(73) Assignee: ETS-Lindgren, LP, Cedar Park, TX (US)

( * ) Notice: Subject to any disclaimer, the term of this patent is extended or adjusted under 35 U.S.C. 154(b) by 447 days.

(21) Appl. No.: 13/848,927

(22) Filed: Mar. 22, 2013

(65) Prior Publication Data

US 2014/0091961 A1    Apr. 3, 2014

Related U.S. Application Data

(60) Provisional application No. 61/708,320, filed on Oct. 1, 2012.

(51) Int. Cl.
*G01S 7/40*          (2006.01)
*G01R 29/10*       (2006.01)

(52) U.S. Cl.
CPC .............. *G01R 29/10* (2013.01); *G01R 29/105* (2013.01)

(58) Field of Classification Search
CPC .............. G01R 29/10; G01R 29/0814; G01R 29/0821; G01R 29/105; G01R 31/001; H01Q 1/12; H01Q 21/225
USPC ................... 342/11, 165, 173, 174; 455/67.12
See application file for complete search history.

(56) References Cited

U.S. PATENT DOCUMENTS

| | | | | |
|---|---|---|---|---|
| 5,274,390 A | * | 12/1993 | Breakall ................ | H01Q 11/10 343/792.5 |
| 5,383,136 A | * | 1/1995 | Cresswell .......... | G01R 31/2818 257/E21.53 |
| 5,410,324 A | | 4/1995 | Bolomey et al. | |
| 5,703,602 A | * | 12/1997 | Casebolt ................ | H01Q 1/244 343/702 |
| 6,208,841 B1 | * | 3/2001 | Wallace ............. | H04B 17/0087 455/67.12 |
| 6,850,851 B1 | | 2/2005 | Fourestie et al. | |
| 7,443,170 B2 | | 10/2008 | Garreau et al. | |
| 7,791,355 B1 | * | 9/2010 | Esher ...................... | G01N 22/00 324/637 |
| 8,493,271 B2 | * | 7/2013 | He ....................... | G01R 29/0814 342/170 |
| 2006/0055592 A1 | * | 3/2006 | Leather .................. | H01Q 3/267 342/174 |
| 2006/0194553 A1 | * | 8/2006 | Ozaki ..................... | G01R 29/10 455/226.1 |
| 2008/0056340 A1 | * | 3/2008 | Foegelle ............ | H04B 17/0082 375/224 |

(Continued)

FOREIGN PATENT DOCUMENTS

WO    2011/138190 A1    11/2011
WO    2012/045879 A1    4/2012

*Primary Examiner* — John B Sotomayor
*Assistant Examiner* — Marcus Windrich
(74) *Attorney, Agent, or Firm* — Christopher & Weisberg, P.A.

(57) ABSTRACT

According to some embodiments, a system is provided for simulating a cluster of reflections. The system includes an array of antenna elements distributed in space over a solid angle having an angular spread. The solid angle is substantially less than a full sphere and each antenna element has a spatial orientation. The system also includes a spatial environment simulator connected to the antenna elements and configured to apply one of excitations to the antenna elements and weights to signals from the antenna elements. The combination of the spatial distribution of the antenna elements, the orientation of the antenna elements, and the weighting applied by the variable path simulator simulates a near field arising from a cluster of reflections of a multipath environment.

18 Claims, 15 Drawing Sheets

(56) References Cited

U.S. PATENT DOCUMENTS

| | | | |
|---|---|---|---|
| 2010/0320996 A1* | 12/2010 | Garreau | G01R 31/001 324/72 |
| 2011/0121839 A1 | 5/2011 | Gandois et al. | |
| 2011/0124295 A1* | 5/2011 | Mahjoubi Amine | H04B 17/0087 455/67.14 |
| 2011/0270567 A1* | 11/2011 | Mow | H04B 17/0087 702/120 |
| 2011/0279320 A1 | 11/2011 | Dumon et al. | |
| 2011/0299570 A1* | 12/2011 | Reed | H04B 7/0434 375/130 |
| 2013/0271317 A1* | 10/2013 | Goel | G01S 19/23 342/357.62 |

\* cited by examiner

METHODS AND APPARATUS FOR EVALUATING RADIATED PERFORMANCE OF MIMO WIRELESS DEVICES IN THREE DIMENSIONS

CROSS-REFERENCE TO RELATED APPLICATION

This application is related to and claims priority to U.S. Provisional Patent Application Ser. No. 61/708,320, filed Oct. 1, 2012, entitled METHODS AND APPARATUS FOR EVALUATING RADIATED PERFORMANCE OF MIMO WIRELESS DEVICES IN THREE DIMENSIONS, the entirety of which is incorporated herein by reference.

STATEMENT REGARDING FEDERALLY SPONSORED RESEARCH OR DEVELOPMENT n/a

FIELD OF THE INVENTION

The present invention relates to a method and system for evaluating radiated performance of Multiple Input Multiple Output (MIMO) wireless devices in three dimensions.

BACKGROUND OF THE INVENTION

The advent of wireless technologies such as LTE and 802.11n, which take advantage of the multipath nature of radio propagation in the real world, have led to the development of test methods for evaluating the radiated performance of these devices in a controlled simulated environment. Current embodiments of these test systems generally evaluate the performance in a statistically uniform, highly multipath environment (reverberation chamber) or in a uniform azimuthal boundary array capable of simulating a wide variety of environments through the application of an appropriate channel model, where the device is rotated through the simulated environment to determine average performance. While the latter boundary array method can generally be expanded to provide full spherical environment simulation, the implementations are generally cost prohibitive. In addition, both methods generally provide average performance metrics without significant detail on the orientation specific impact of the device performance.

SUMMARY OF THE INVENTION

Embodiments advantageously provide systems and methods for evaluating the performance of wireless devices in a simulated multipath RF environment. In one embodiment, a plurality of antennas are arranged in a constellation distributed over a solid angle, such as on the two-dimensional surface of a sphere, to simultaneously transmit or receive signals simulating a single cluster of reflections in a real 3-D environment. A variety of different mechanisms may then be used to rotate the cluster relative to the device under test (DUT) to map a three dimensional picture of the device's performance in the presence of a faded multipath channel.

According to some embodiments, a system is provided for simulating radiation from a cluster of reflections. The system includes an array of antenna elements distributed in space over a solid angle having an angular spread. The solid angle covers substantially less than a full sphere and each antenna element has a spatial orientation. The system also includes a variable path simulator in communication with the antenna elements. The combination of the spatial distribution of the antenna elements, the orientation of the antenna elements, and weighting applied by the variable path simulator cause simulation of a near field environment arising from a cluster of reflections of a multipath environment.

According to some embodiments, a method is provided for simulating radiation from a cluster of reflections. The method includes providing a spatial distribution of antenna elements over a solid angle having an angular spread, where the solid angle covers substantially less than a full sphere. The method includes connecting each antenna element to a variable path simulator. The variable path simulator is configured to communicate with the antenna elements. The method also includes adjusting at least one of the spatial distribution, orientations, and weighting applied by the variable path simulator to simulate a near field arising from a cluster of reflections.

According to some embodiments, an anechoic test chamber is provided to test a response of an RF device to a cluster of reflections of a multipath environment. The anechoic test chamber includes an enclosed room and a plurality of antenna elements. Each antenna element has a connector to enable connection of an antenna element to a variable path simulator. The plurality of antenna elements are mounted to at least one structure so that the antenna elements are distributed in space over a solid angle that covers substantially less than a full sphere. At least one structure is provided upon which to mount the antenna elements. A positioner supports a radio frequency, RF, device to be tested within the chamber.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION OF THE INVENTION

Figure 1:
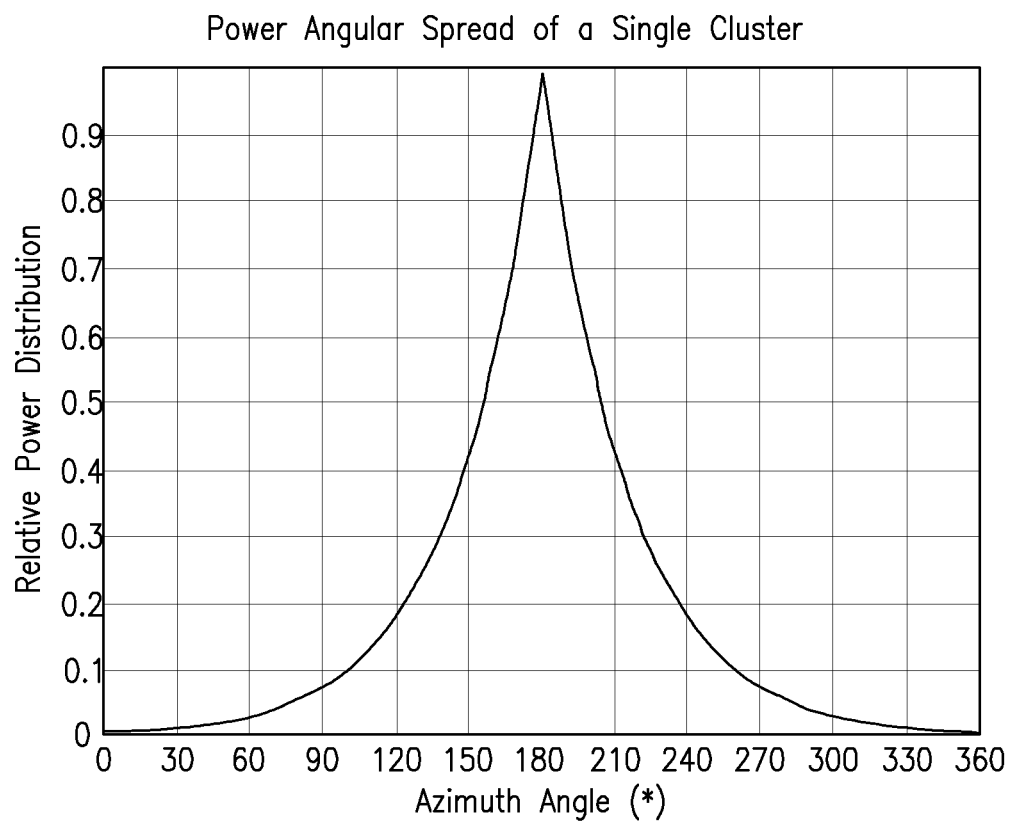
FIG. 1 is a graph of a power angular spread of a single cluster showing a relative power distribution as a function of azimuth angle.

Before describing in detail exemplary embodiments that are in accordance with the present invention, it is noted that the embodiments reside primarily in combinations of apparatus components and processing steps related to evaluating radiated performance of MIMO wireless devices in three dimensions. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

In considering the possible continuum of propagation environments that a wireless device might encounter, the range varies from the extremely high multipath behavior produced by a reverberation chamber (which produces an excellent multi-path environment for MIMO operation, but isn't highly likely to be seen to that extent in any real world scenario) to a direct line of sight, with no multi-path and no real de-correlation between the transmitted/received signals. The direct line of sight (LOS) case in a completely anechoic environment is similar to the test methodologies currently used to evaluate the performance of SISO (single antenna) radios. However, this approach is not suitable for testing the performance enhancements of multiple antenna wireless technologies like MIMO and diversity.

At the edge of this continuum near the LOS case is the concept of a single cluster of reflections, which produces a multipath propagation condition with only a small amount of differentiation (i.e. the signals are still highly correlated along the main direction of propagation). Such a cluster of reflections may be encountered in the real world. For example, a main reflector may be a broad side of a nearby building with correlated reflections from nearby objects. Unlike the uniformly illuminated and highly uncorrelated environment of a reverberation chamber, where any MIMO device can be expected to perform reasonably well, the single cluster scenario provides an environment that can be expected to produce a notably different level of performance between a "good" and "bad" MIMO device due to the difficulty in sorting out the highly correlated signals from the multiple transmitters. Conversely, the single cluster only provides an indication of the performance of the device in a principal direction of the cluster. By manipulating the orientation of the cluster relative to the DUT, it is possible to evaluate the performance of the device as a function of direction. Additionally, the average of that directional performance provides an indication of the average performance of the device that may be considerably different from its performance in a statistically uniform (averaged) environment.

Figure 2:
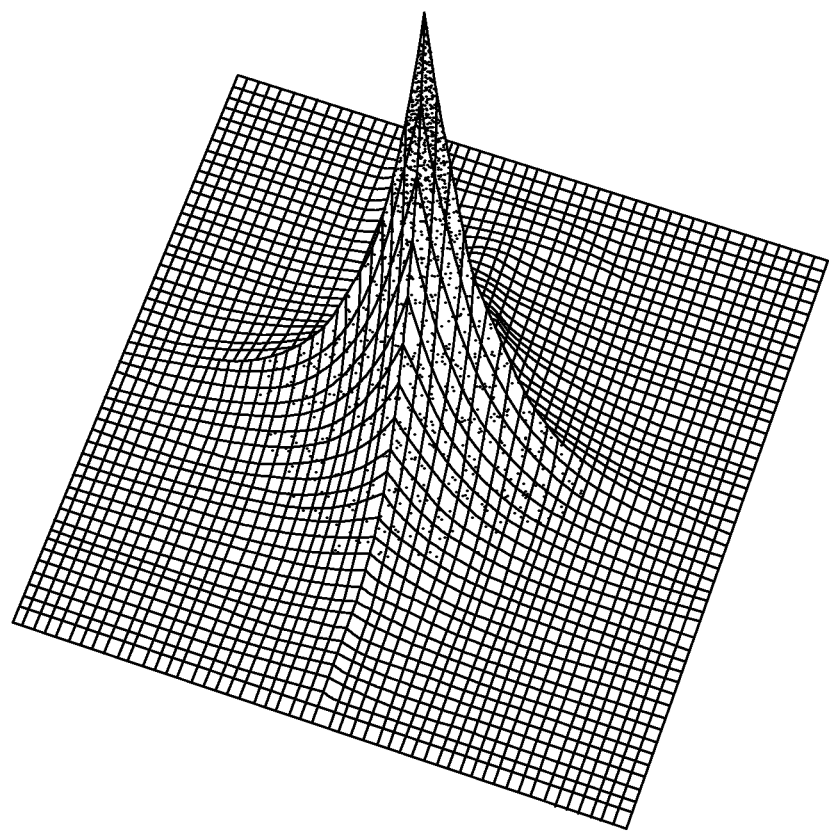
FIG. 2 is a graph of a distribution along two orthogonal directions.
Figure 3:
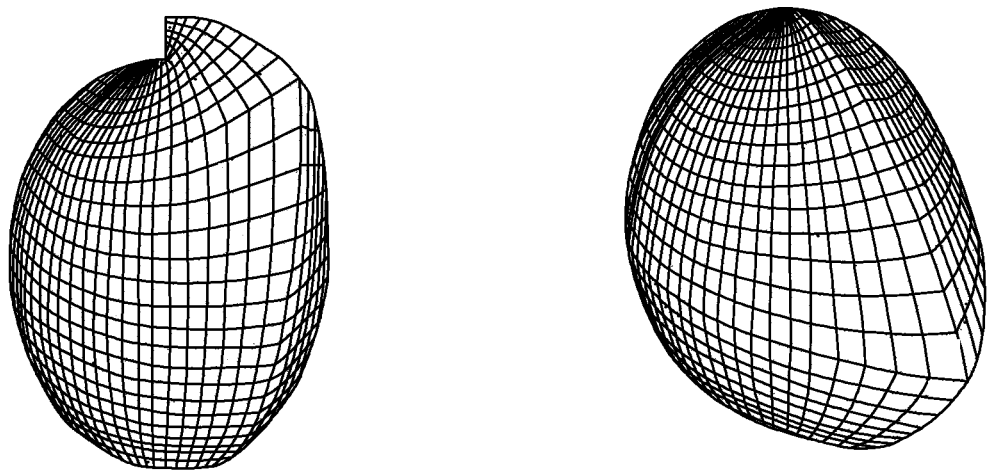
FIG. 3 is a graph for a two-axis cluster at two different points on a surface of a sphere.
Figure 4:
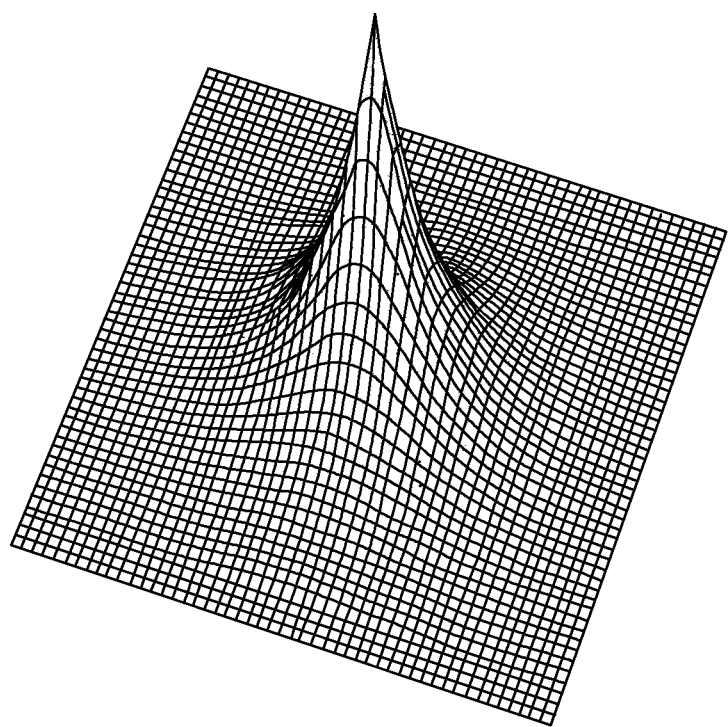
FIG. 4 is a graph for a uniform distribution suitable for representing a single cluster at an arbitrary point on the surface of a sphere.
Figure 5:
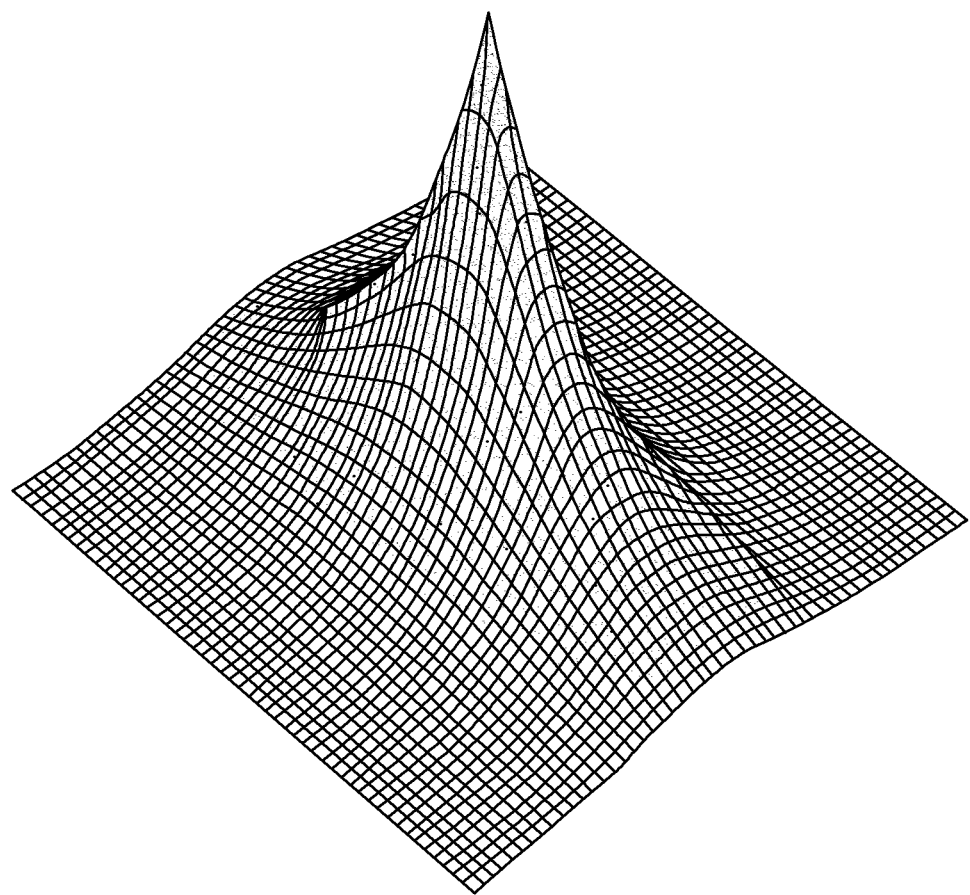
FIG. 5 is a graph for an elliptically shaped cluster with a uniform variation in direction around the center of the cluster.

Standardized channel models may only define two-dimensional models with a cluster represented by a distribution in azimuth about the DUT as shown in FIG. 1. The distribution of FIG. 1 may be obtained from an array of antennas in an arc around the RF device. One may envision providing a distribution along two orthogonal directions, as shown in FIG. 2. However, simply providing a distribution along two orthogonal directions does not necessarily produce the desired result. For spherical coverage, the commonly chosen directions correspond to the theta and phi directions of a spherical surface; however, those locations are not orthogonal at all points on the surface of a sphere, and thus such a distribution becomes distorted at orientations other than theta=90°, as shown in FIG. 3. One solution for this is to define a cluster using a radial distribution on the surface to produce a distribution such as shown in FIG. 4. This provides a more realistic representation of a "spot" on the surface of a sphere that represents a cluster of reflections from a given region. The shape of the spot (cluster) can be varied to represent a realistic geometry, as shown, for example, in FIG. 5, without being affected by the spherical representation used in most measurement systems.

Figure 6:
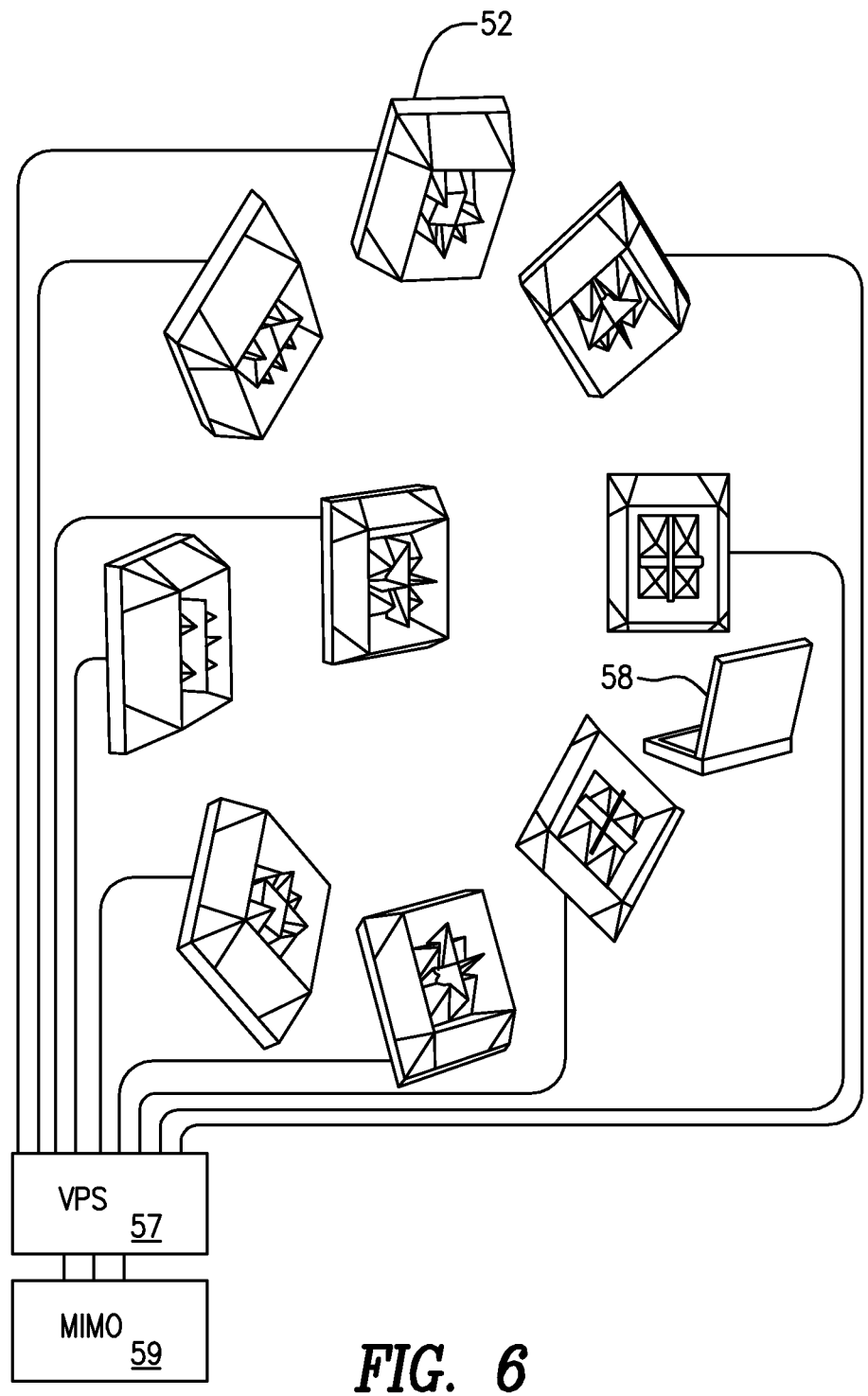
FIG. 6 is an illustration of a partial surface boundary array suitable for simulating a cluster of reflections in communication with a variable path simulator and a MIMO tester.

FIG. 6 shows an embodiment of an array of antenna elements 52 distributed in space over a solid angle having an angular spread that may be used to simulate a cluster of reflections about a given propagation direction around a device 58. In some embodiments, the solid angle covers substantially less than a full sphere. For example, the solid angle may be less than 120 degrees, less than 90 degrees, less than 60 degrees, less than 45 degrees or less than 30 degrees. The angular spread of the antenna elements may be one value in one direction and another value in another direction, such as for an elliptical distribution of antenna elements. Thus, as used herein, the term 'solid angle' may refer to a spherical solid angle or a solid angle of another shape.

Figure 7:
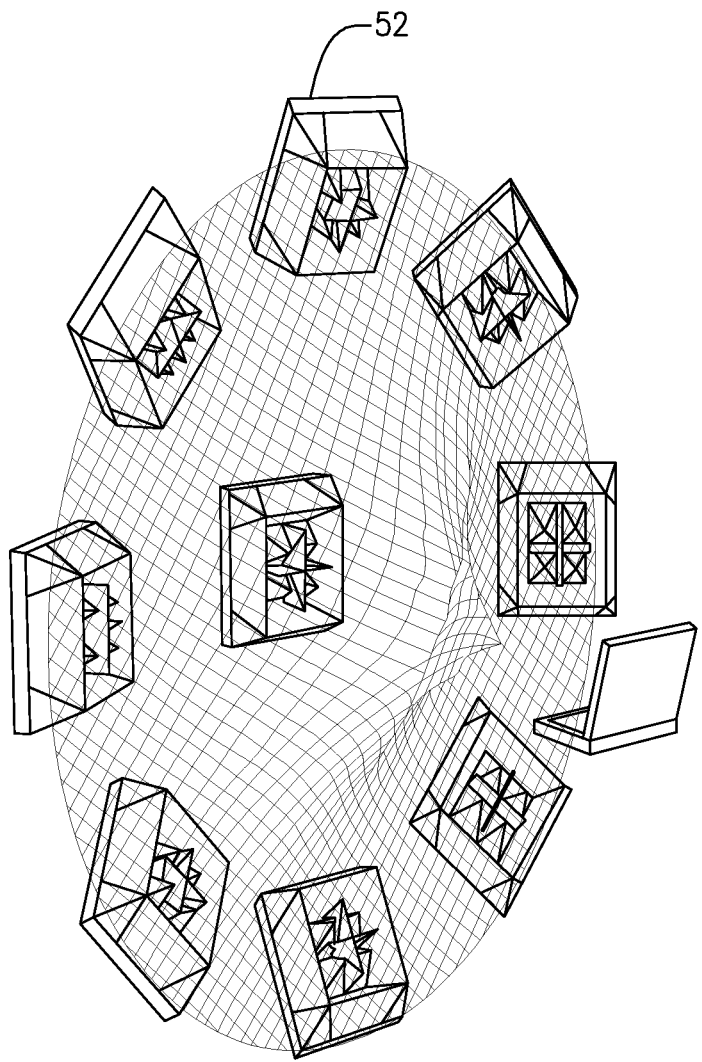
FIG. 7 is an illustration of how a cluster distribution may be mapped to the partial boundary array.

The array of elements 52 may be referred to herein as a boundary array because the elements may be visualized as being on a surface that bounds a device under test. Each linearly polarized element of the array may be fed simultaneously by a variable path simulator 57, such as a channel emulator, configured to produce a fading profile with the target environmental specifications including the angular spread of the simulated cluster in each direction. One result is a directional power profile applied to the device with controlled variability in polarization and orientation such as shown in FIG. 7.

As shown in FIG. 6, the variable path simulator 57 has M paths in communication with up to M antennas and N paths in communication with another device 59 or antenna array. In some embodiments, the variable path simulator 57 is implemented with passive components only, whereas in other embodiments, the variable path simulator 57 includes active components. The variable path simulator 57 may provide communication between the boundary array of FIG. 6, and a MIMO tester 59, a radio such as a radio base station or wireless device, another boundary array or another variable path simulator. In some embodiments, the MIMO tester or the radio may be integrated with the variable path simulator.

The variable path simulator 57 may be used to weight signals from or to the antenna elements 52 and to introduce multi-path propagation to the system. The combination of the spatial distribution of the antenna elements, the orientation of the antenna elements, and weighting applied by the variable path simulator may cause a simulation of a near field environment arising from a cluster of reflections of a multipath environment. In some embodiments, the variable path simulator transmits signals to the antenna elements or receives signals from the antenna elements. In some embodiments, the variable path simulator may both transmit and receive signals simultaneously or sequentially.

The boundary array method reproduces a target environment by using an array of independent antenna elements 52 to reproduce the RF conditions at a bounding surface around the device 58. In the ideal case of an infinite number of infinitesimally small dual polarized dipole elements, any desired conditions may be re-created within the region enclosed within the volume. For the more realistic case of a finite number of elements, the element spacing on the bounding surface determines the net separation distance over which two antenna elements within the test volume will see the same field structure as in the ideal case. Beyond this maximum correlation distance, the resulting behavior seen by the device 58 breaks down and the device 58 is essentially able to resolve the individual elements in the boundary array. In the case of a single cluster illumination of the device, only a relatively small portion of the boundary surface around the device needs to generate a signal, since the contribution from other orientations approaches zero. Thus, the same number of channel emulation resources and boundary array antennas that might be used to generate an azimuthal or spherical boundary condition may be condensed into a much smaller area, increasing the overall size of the test volume over which the ideal correlation behavior is maintained.

Thus, in some embodiments, the antenna array elements may be distributed evenly over a solid angle or may be distributed unevenly with a greater density of elements close to a center of the array and a lower density of elements away from the center of the array, for example. As another example, the antenna elements may be positioned on an imaginary spherical or parabolic surface. The spatial distributions of the antenna elements, the orientations of the antenna elements and the excitations applied to the antenna elements may be chosen to create a specific desired radiation distribution such as, for example, a substantially Gaussian distribution, a substantially Laplacian distribution or a substantially elliptical distribution.

Figure 8:
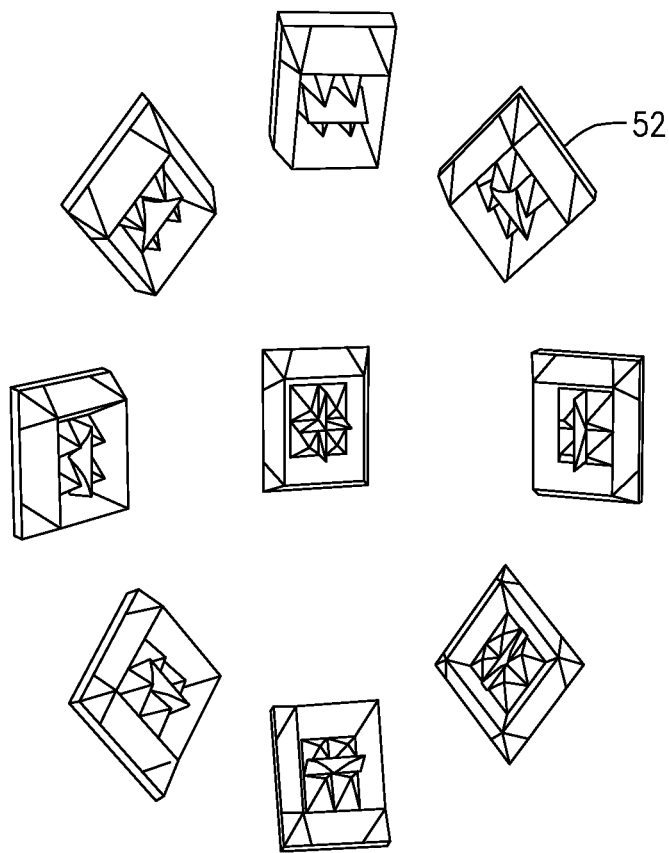
FIG. 8 is an illustration of a single cluster boundary array with single polarized elements along the edge of the cluster.
Figure 9:
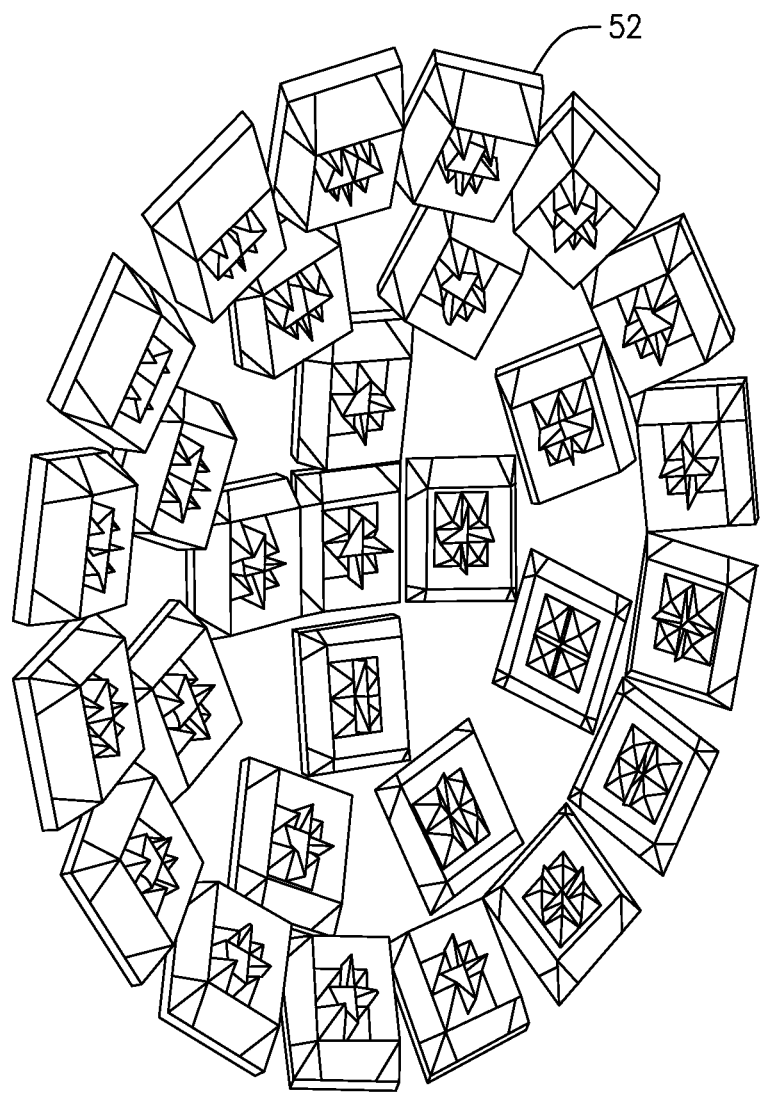
FIG. 9 is an illustration of a high resolution antenna array.
Figure 10:
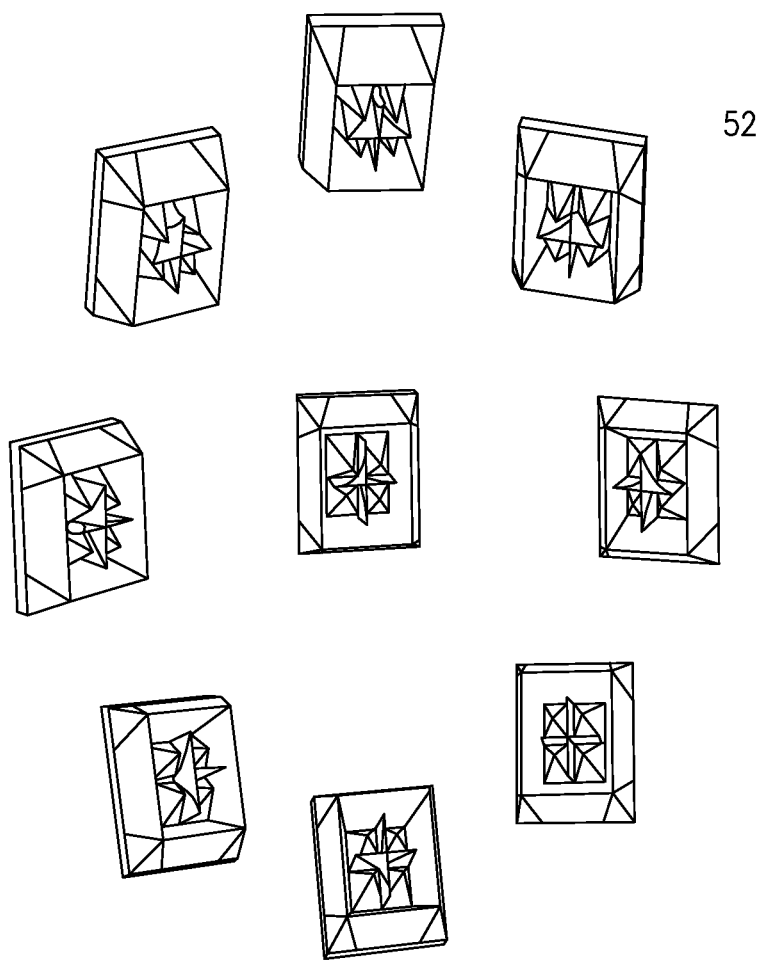
FIG. 10 is an illustration of an implementation where the dual polarized elements are oriented to be approximately co-polarized.

To further reduce the number of channel emulation resources, possible implementations include using only one polarization in each radial orientation of the single cluster array, as shown in FIG. 8. The net effect of the cluster is still a dual polarized behavior that can support an angular distribution and a cross polarization ratio (XPR), but with roughly half the number of antenna elements. In particular, some embodiments may include at least one single polarized element and at least one dual polarized element. Likewise, possible implementations may have more antenna elements to produce a higher resolution boundary condition or support larger angular spreads for a given cluster, as shown in FIG. 9. In addition, the orientations of the antenna elements may be have a desired orientation. Certain orientations may make it easier to calculate the desired field distribution in the channel model. FIG. 10 illustrates an embodiment where all elements are oriented to be approximately co-polarized, allowing for implementation of a theta/phi type orthogonal coordinate measurement system. Note, however, that a uniform surface distribution of the cluster may prevent all elements from being exactly co-polarized, since the orientation of a phi axis cut is not truly orthogonal to a theta cut at all points on the surface of a sphere.

Figure 11:
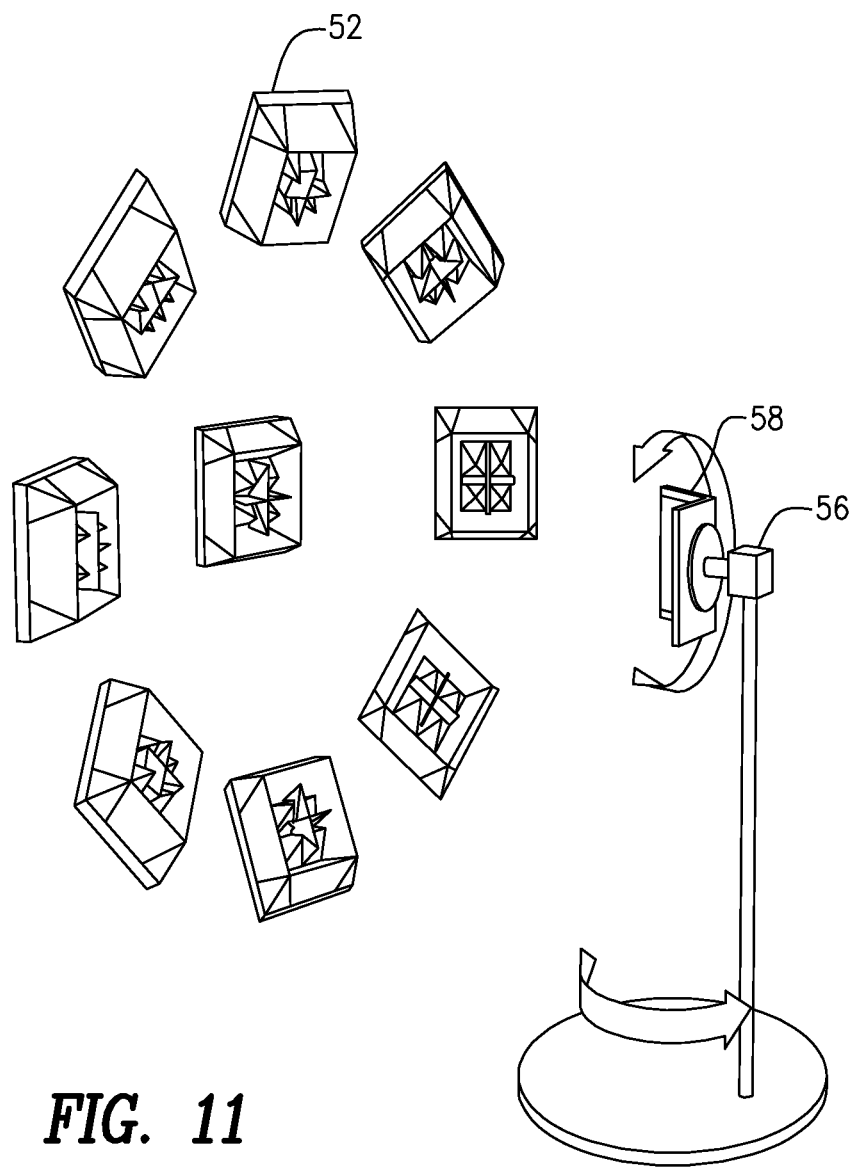
FIG. 11 is an illustration for providing a 3-D manipulation of a fixed single cluster boundary array about a device under test (DUT)
Figure 12:
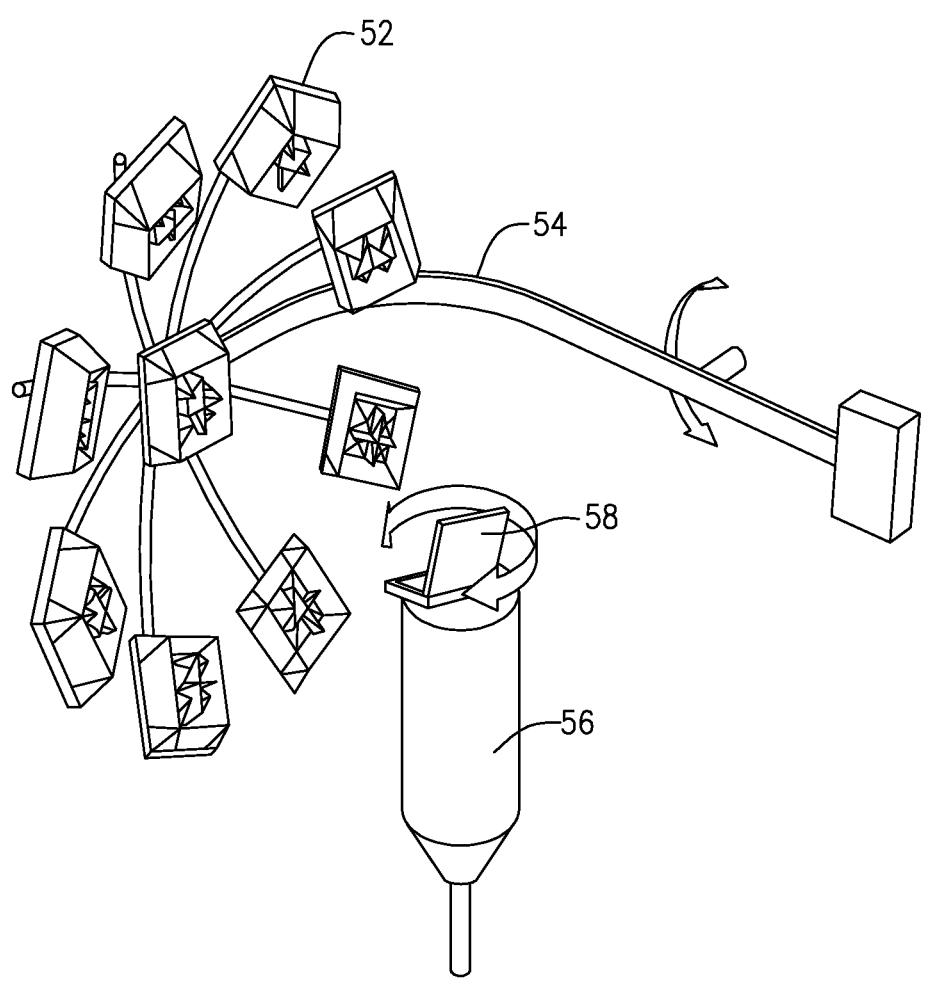
FIG. 12 is an illustration of mounting of a single cluster boundary array on a theta arm to allow elevating the cluster around a DUT on a turntable.
Figure 13:
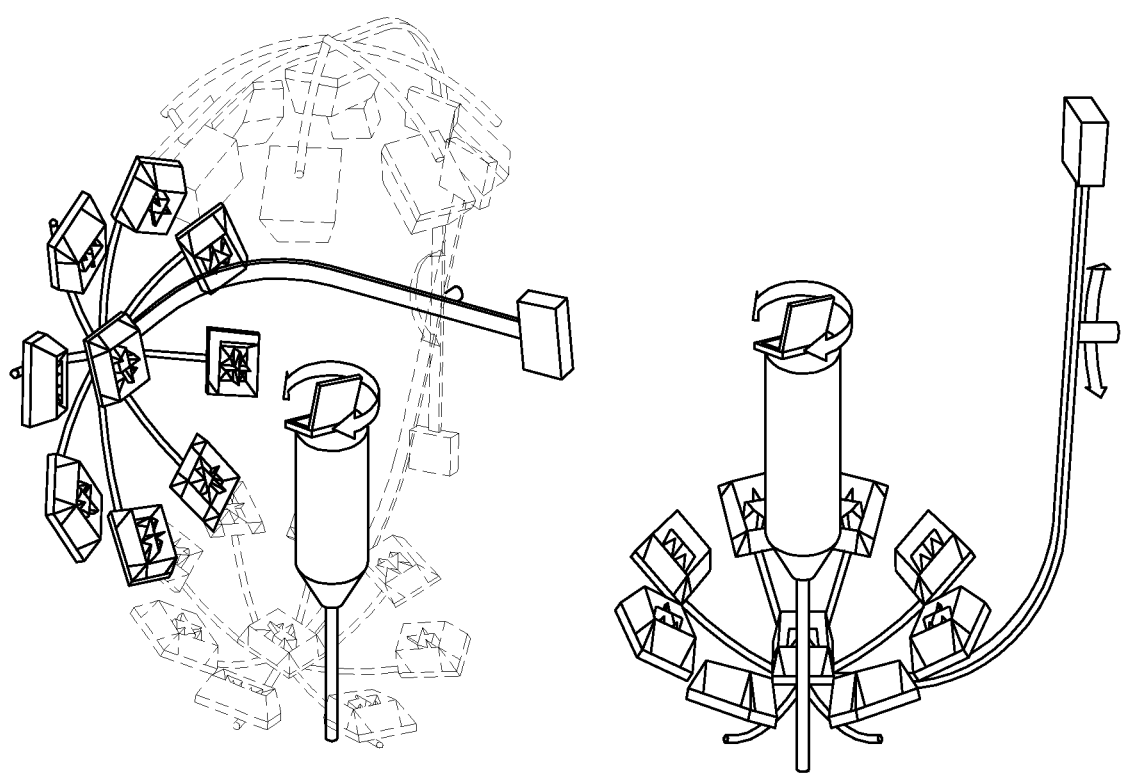
FIG. 13 is an illustration of rotating the single cluster boundary array of FIG. 12 about theta.

The benefits of a cluster of antenna elements to simulate a cluster of reflections, in terms of boundary array resolution, may only be realized, in some embodiments, in terms of wireless device evaluation if the device performance can be evaluated with the same cluster oriented in different directions around the device. For small devices, such as the device 58, that can be mounted on a positioner 56 and manipulated in two axes of motion, the embodiment shown in FIG. 11 can be used, where the array of antenna elements 52 remains fixed, mounted to the walls or other structure in an anechoic chamber, and the device is rotated on a multi-axis positioning system (MAPS) 56. An alternate embodiment is to move the cluster of antenna elements 52 on a theta arm 54, as shown in FIG. 12, where the array has been specifically designed to provide the necessary clearance for the phi axis positioner 56 to allow the center of the cluster to approach theta=180°, as shown in FIG. 13. Likewise, the phi axis turntable 56 shown in FIG. 12 could be mounted on a goniometer tilt axis to allow it to tilt towards or away from the single cluster array, again fixed on the wall or ceiling, or with a smaller range of motion itself.

Thus, the antenna elements can be mounted on one or more structures. Such structure(s) can be rotated about an axis. Such rotation may enable the structure and antenna elements to be rotated about a device under test, DUT. For example, as shown in FIGS. 12 and 13, the structure may include spaced apart arms that emanate from a center of the structure. The RF device to be tested may itself be positioned on a positioner that rotates about one or more axis. An axis of rotation of the positioner may be the same or different from an axis of rotation of the array of antenna elements mounted on a rotatable structure. Thus, in some embodiments, the array rotates and the device under test rotates so that the array may point at any point on the device under test, providing full spherical coverage. In some embodiments, only the device under test rotates about two axis to provide full spherical coverage.

In some embodiment, a third axis of rotation could be added that is orthogonal to the first two axes of rotation to provide rotation about all three Euler angles, thereby allowing for rotation of both the location and the polarization of the cluster relative to the device under test. Also, the statistical distribution of the cluster can be rotated electronically by the variable path simulator to produce a desired third axis of rotation, changing the shape and polarization of the cluster applied to the array.

Figure 14:
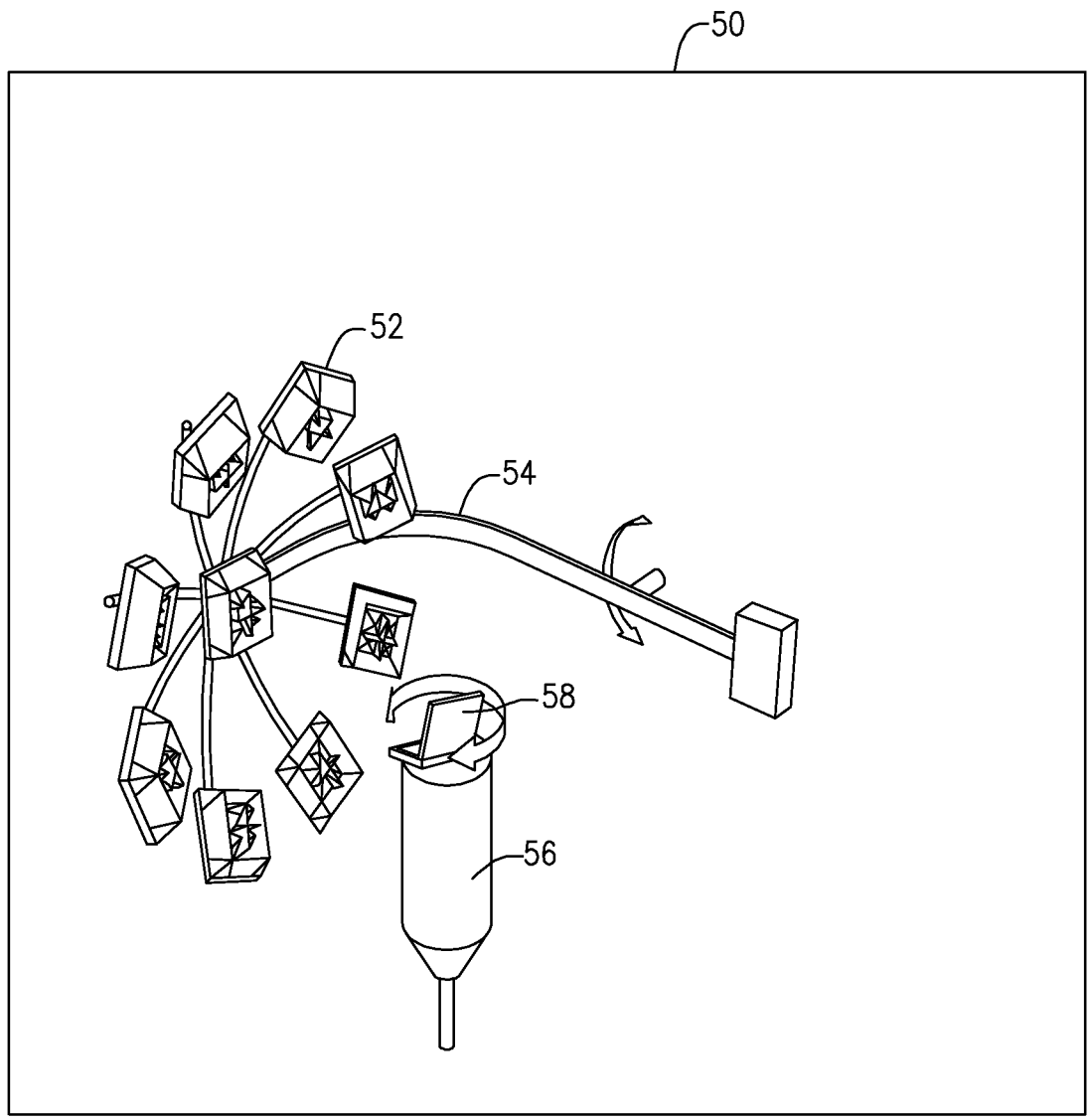
FIG. 14 is a diagram of an enclosed test chamber having an antenna array constructed in accordance with principles of the present invention.

FIG. 14 shows a test chamber 50 to test a response of an RF device to a cluster of reflections of a multipath environment. In some embodiments, the test chamber is an anechoic chamber that may be an enclosed room 50 that is partially or fully lined with anechoic absorber (not shown). The enclosed room 50 has a plurality of antenna elements 52. Each antenna element 52 has a connector by which the antenna element may be connected to a variable path simulator (not shown). The variable path simulator may be located interior of the room or exterior of the room. At least one structure 54 is provided, upon which the antenna elements 52 are mounted in such a way that the antenna elements are distributed in space over a solid angle that is substantially less than a sphere. A positioner 56 is provided to support an RF device 58 to be tested within the chamber. In some embodiments, the structure upon which the antenna elements are mounted is rotatable about a first axis, and the positioner is rotated about at least a second axis. The second axis may be parallel or perpendicular to the first axis.

Figure 15:
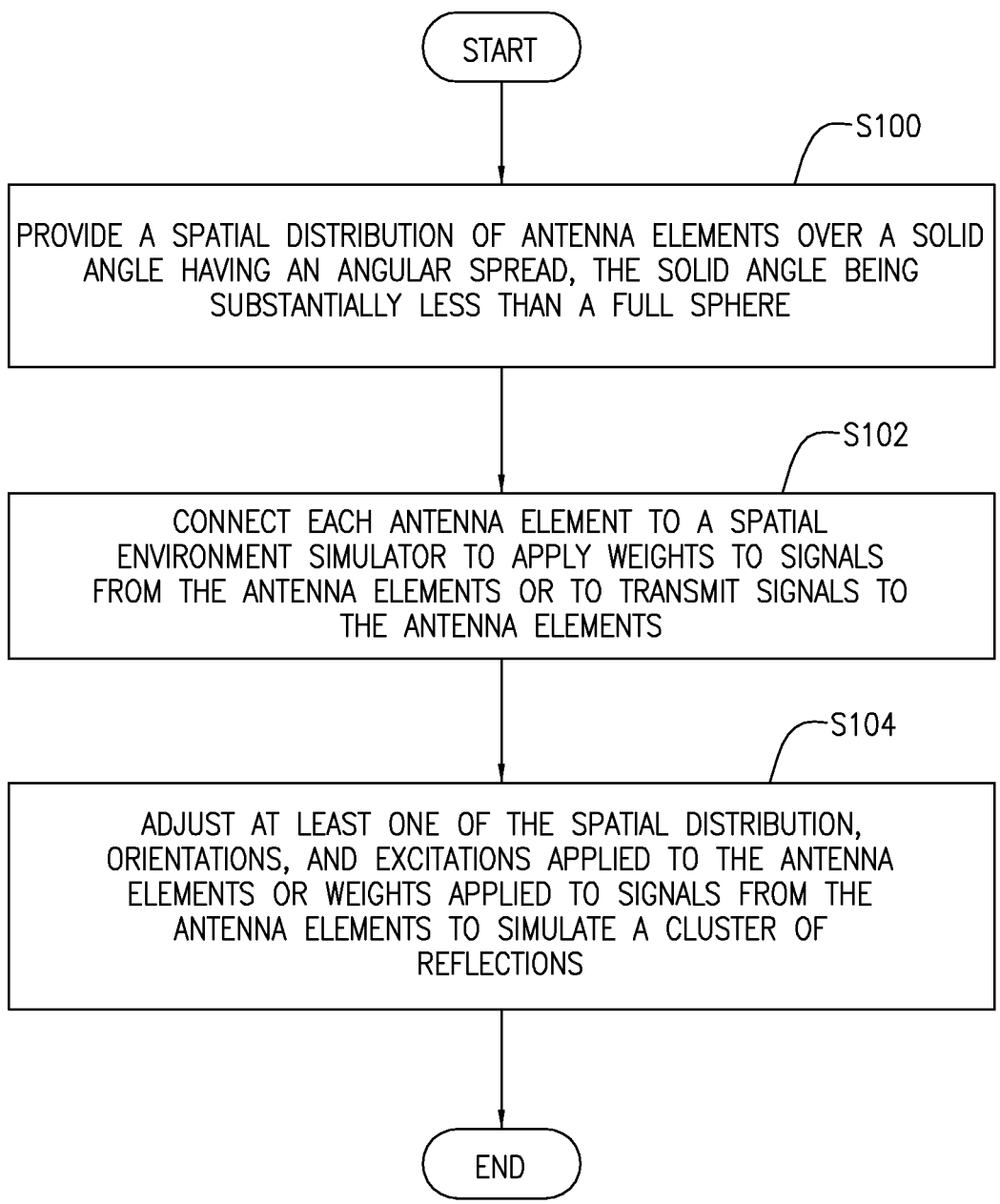
FIG. 15 is a flowchart of an exemplary process of simulating a cluster of reflections.

FIG. 15 is a flowchart of an exemplary process for simulating radiation from a cluster of reflections to illuminate a device under test. A spatial distribution of antenna elements over a solid angle having an angular spread is provided, where the solid angle is substantially less than a sphere (block S100). Each antenna element is connected to a variable path simulator, such as a channel emulator, to apply excitations to the antenna elements (block S102). A cluster of reflections may be simulated by adjusting at least one of the spatial distribution, orientations, and excitations of the antenna elements or weights applied to signals from the antenna elements.

Note that additional elements could be added to the array, and the electrical center of the array could be shifted by suitable excitation of the array elements to simulate a cluster emanating from a different direction. This may be done instead of or in addition to rotating the cluster of antenna elements. Note also, that the invention has been described primarily by reference to excitation of the antennas via a simulator. Conversely, the antennas can be excited by radiation from a device under test to produce at each antenna element a signal that may be weighted by the simulator to emulate a cluster of reflections.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A system for simulating a cluster of reflections, the system comprising:
   an array of antenna elements distributed in space over a surface having finite curvature and bound by a solid angle having an angular spread, the solid angle covering substantially less than a full sphere, but extending over a region to enable the antennas to simulate a near field environment arising from a cluster of reflections of a multipath environment, each antenna element having a spatial orientation, the antenna elements being mounted on a structure that includes spaced apart arms that emanate from a center of the structure, the spaced apart arms being curved and distributed to position the antenna elements over the surface having finite curvature and bound by the solid angle; and
   a variable path simulator in communication with the antenna elements, the combination of the spatial distribution of the antenna elements, the orientation of the antenna elements, and weightings applied by the variable path simulator to signals of the antenna elements, causing a simulation of a near field environment arising from a cluster of reflections of a multipath environment.

2. The system of claim 1, wherein the antenna elements are distributed evenly over the solid angle, and spaced closely enough that a device under test cannot resolve an individual radiation pattern of each of the antenna elements.

3. The system of claim 1, wherein the antenna elements are positioned on a spherical surface.

4. The system of claim 1, wherein a density of antenna elements close to a center of the array is greater than a density of antenna elements further away from the center of the array.

5. The system of claim 1, wherein the spatial distribution, the spatial orientations and excitations of the antenna elements are chosen to cause the array to exhibit a radiation distribution that is substantially Gaussian.

6. The system of claim 1, wherein the spatial distribution, the spatial orientations and excitations of the antenna elements are chosen to cause the array to exhibit a radiation distribution that is substantially Laplacian.

7. The system of claim 1, wherein the spatial distribution, the spatial orientations and excitations of the antenna elements are chosen to cause the array to exhibit a radiation distribution that is substantially elliptical.

8. The system of claim 1 wherein the weights applied by the variable path simulator are chosen to shift an electrical center of the array.

9. The system of claim 1, wherein the structure is rotatable about an axis to rotate the array of antenna elements about a device under test through an angle to sequentially cover different solid angles surrounding the device under test.

10. The system of claim 1, wherein the structure is rotatable about a first axis to rotate the array of antenna elements through an elevation about a device, and the system further includes a device positioner that is rotatable about at least a second axis to rotate the device azimuthally.

11. The system of claim 10, wherein one of the structure and the positioner are further rotatable about a third axis different from the first or second axis.

12. The system of claim 1, wherein at least one of the antenna elements is dual-polarized and at least one of the antenna elements is single-polarized.

13. A method of simulating a cluster of reflections, the method comprising:
   providing a spatial distribution of antenna elements over a solid angle having an angular spread, the solid angle covering substantially less than a full sphere, the antenna elements being mounted on a structure that includes spaced apart arms that emanate from a center of the structure, the spaced apart arms being curved and distributed to position the antenna elements over the surface having finite curvature and bound by the solid angle;
   connecting each antenna element to a variable path simulator, the variable path simulator configured to communicate with the antenna elements; and
   adjusting at least one of the spatial distribution, orientations, and weightings applied by the variable path simulator to signals of the antenna elements to simulate a near field environment arising from a cluster of reflections.

14. The method of claim 13, further providing an anechoic chamber surrounding the spatial distribution of antenna elements.

15. An anechoic test chamber to test a response of an RF device to a cluster of reflections of a multipath environment, the anechoic test chamber comprising:
   an enclosed shielded room at least partially lined with RF absorber;
   a plurality of antenna elements, each antenna element having a connector to enable connection of an antenna element to a variable path simulator that applies weights to signals of the antenna elements; and
   at least one structure upon which to mount the antenna elements, the structure including spaced apart arms that emanate from a center of the structure, the spaced apart arms being curved and distributed to position the antenna elements over a surface having finite curvature and bound by a solid angle extending over substantially less than a full sphere; and
   a positioner to support a radio frequency, RF, device to be tested within the chamber.

16. The anechoic test chamber of claim 15, wherein the at least one structure is rotatable about a first axis.

17. The anechoic test chamber of claim 16, wherein the positioner is rotatable about a second axis.

18. The anechoic test chamber of claim 17, wherein the positioner is further rotatable about a third axis.

* * * * *